US012794415B2

(12) United States Patent
Kimura

(10) Patent No.: US 12,794,415 B2
(45) Date of Patent: Nov. 10, 2026

(54) RELAXATION OSCILLATOR

(71) Applicant: OmniVision Integrated Circuits Group, Inc., Shanghai (CN)

(72) Inventor: Hiroyuki Kimura, Sendai (JP)

(73) Assignee: OMNIVISION INTEGRATED CIRCUITS GROUP, INC., Shanghai (CN)

( * ) Notice: Subject to any disclaimer, the term of this patent is extended or adjusted under 35 U.S.C. 154(b) by 0 days.

(21) Appl. No.: 18/642,249

(22) Filed: Apr. 22, 2024

(65) Prior Publication Data

US 2025/0239970 A1 Jul. 24, 2025

(30) Foreign Application Priority Data

Jan. 22, 2024 (JP) ................................ 2024-007493

(51) Int. Cl.

| | |
|---|---|
| ***H03B 5/24*** | (2006.01) |
| ***H03K 3/011*** | (2006.01) |
| ***H03K 3/0231*** | (2006.01) |
| ***H03K 4/501*** | (2006.01) |

(52) U.S. Cl.

CPC ............... *H03B 5/24* (2013.01); *H03K 3/011* (2013.01); *H03K 3/0231* (2013.01); *H03K 4/501* (2013.01)

(58) Field of Classification Search

CPC ...... H03K 3/354; H03K 4/502; H03K 3/0231; H03K 4/501; H03B 5/24

See application file for complete search history.

(56) References Cited

U.S. PATENT DOCUMENTS

| | | | | |
|---|---|---|---|---|
| 6,362,697 | B1 * | 3/2002 | Pulvirenti | H03K 3/354 331/111 |
| 2009/0146749 | A1 | 6/2009 | Ng et al. | |
| 2024/0223127 | A1 * | 7/2024 | Li | H03K 3/354 |

FOREIGN PATENT DOCUMENTS

| | | | |
|---|---|---|---|
| JP | H08274595 | A | 10/1996 |
| JP | 2015056692 | A | 3/2015 |
| WO | WO2006/092842 | A1 | 9/2006 |

OTHER PUBLICATIONS

Sodoini et al., "Lecture 12: Digital Circuits (II) MOS Inverter Circuits", 2009, retrieved from https://ocw.mit.edu/courses/6-012-microelectronic-devices-and-circuits-spring-2009/resources/mit6_012s09_lec12/ (Year: 2009).*

(Continued)

*Primary Examiner* — Ryan Johnson

(74) *Attorney, Agent, or Firm* — MUNCY, GEISSLER, OLDS & LOWE, P.C.

(57) ABSTRACT

A relaxation oscillator to stably output a signal of a predetermined frequency includes a first transistor that provides a constant current to charge a first capacitor, and a second transistor that draws charge from the first capacitor. A third transistor supplies current to charge a second capacitor, while a fourth transistor draws charge from the second capacitor. A flip-flop FF switches states based on the charging voltages of the first capacitor and the second capacitor, controlling the on/off states of the second transistor and the fourth transistor accordingly. The flip-flop outputs a signal of a predetermined frequency.

2 Claims, 4 Drawing Sheets

(56) References Cited

OTHER PUBLICATIONS

Baidya, Sima, and Arindam Chakraborty. "A Comparative study on Bulk PMOS resistive load inverter and Double gate PMOS resistive load inverter." International Journal of Engineering and Technical Research (IJETR) ISSN: 2321-0869, vol. 3, Issue-4, Apr. 2015 (Year: 2015).*

Wang et al., "A 12.77-MHz 31 ppm/○C On-Chip RC Relaxation Oscillator With Digital Compensation Technique," IEEE Transactions On Circuits And Systems—I: Regular Papers, vol. 63, No. 11, Nov. 2016, pp. 1816-1824.

Notice of Reasons for Refusal dated Jun. 16, 2026 in relation to the corresponding Japanese Patent Application No. 2024007493.

* cited by examiner

RELAXATION OSCILLATOR

BACKGROUND OF THE INVENTION

1. Field of the Invention

The disclosure relates to a relaxation oscillator that oscillates using the on/off of a switch.

2. Description of the Related Art

Conventionally, as one of oscillation circuits, a relaxation oscillator that generates intermittent electrical signals by controlling on/off timing of a switch is known. For example, a capacitor is charged, a comparator detects that the charging voltage thereof has reached a predetermined value, and the on/off timing of the switch is determined.

PRIOR ART DOCUMENTS

Non-Patent Documents

[Non-patent document 1] "A 12.77-MHz 31 ppm/C On-Chip RC Relaxation Oscillator With Digital Compensation Technique" IEEE TRANSACTIONS ON CIRCUITS AND SYSTEMS-1: REGULAR PAPERS, VOL. 63, NO. 11, November 2016

SUMMARY OF THE INVENTION

Problems to be Solved

In view of this, for accurate and stable oscillation, the comparator requires high speed and high precision, which consumes large currents and requires large-scale circuits.

In addition, when the comparator detects that the charging voltage of the capacitor has reached the predetermined value, the charging current becomes smaller in the vicinity of a trigger point, and therefore, there is a problem that an operation at the trigger point is likely to be unstable.

Means to Solve Problems

A relaxation oscillator related to the disclosure includes: a first transistor, through which a constant current is made to flow; a first capacitor, which is charged by a current from the first transistor; a second transistor, which draws a charge of the first capacitor; a third transistor, through which a constant current is made to flow; a second capacitor, which is charged by a current from the third transistor; a fourth transistor, which draws a stored charge of the second capacitor; and a flip-flop, whose state changes from a first state to a second state when a charging voltage of the first capacitor reaches a predetermined value, and changes from the second state to the first state when a charging voltage of the second capacitor reaches a predetermined value, the flip-flop causing the second transistor to be turned off and the fourth transistor to be turned on in the first state, and causing the second transistor to be turned on and the fourth transistor to be turned off in the second state; and the relaxation oscillator outputs a signal of a predetermined frequency from the flip-flop.

Effects

According to the relaxation oscillator related to the disclosure, a constant current is used for charging, the slope of the voltage is still constant even in the vicinity of the trigger point, and therefore a stable operation can be obtained.

PREFERRED EMBODIMENT OF THE PRESENT INVENTION

Hereinafter, embodiments of the disclosure will be described below with reference to the drawings. Note that, the following embodiments do not limit the scope of the disclosure, and configurations obtained by selectively combining multiple examples are also included in the disclosure.

Circuit Configuration

Figure 1:
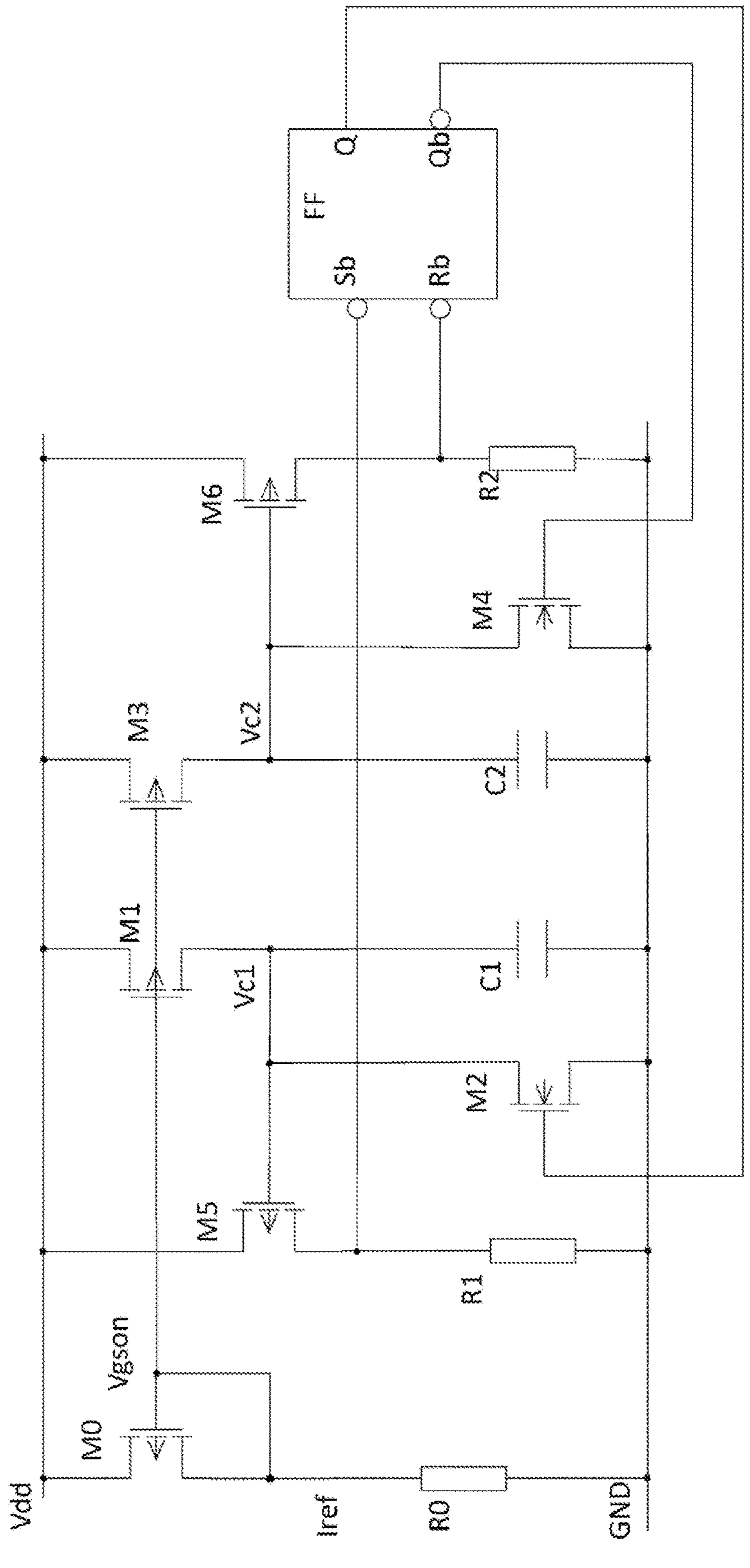
FIG. 1 is a circuit diagram showing the configuration of a relaxation oscillator according to an embodiment.

FIG. 1 is a circuit diagram showing the configuration of a relaxation oscillator according to an embodiment. In this circuit, a metal oxide semiconductor field effect transistor (MOSFET) whose control end is the gate is used as the transistor.

The source of a p-channel transistor M0 is connected to a power supply Vdd, and the drain is connected to a ground GND via a resistor R0. There is a short circuit, that is a diode connected between the gate and the drain of the transistor M0. Accordingly, a constant current Iref determined by a voltage (Vdd) of the power supply Vdd and a resistance value of the resistor R0 flows through the transistor M0 and the resistor R0.

The gate of a p-channel transistor M1 is connected to the gate of the transistor M0. The source of the transistor M1 is connected to the power supply Vdd, and the drain is connected to the ground GND via a capacitor C1. Because the transistor M0 and the transistor M1 constitute a current mirror, by making the two transistors equivalent, the same current Iref as the transistor M0 flows through the transistor M1, and the capacitor C1 is charged with the current Iref. Moreover, by changing the ratio of the size of the input side transistor to the size of the output side transistor of the current mirror, the ratio of the currents flowing through the two transistors can be changed.

In addition, the drain of an n-channel transistor M2 is connected to a connection point between the drain of the transistor M1 and the capacitor C1, and the source of the transistor M2 is connected to the ground. Accordingly, the capacitor C1 is discharged when the transistor M2 is turned on.

The gate of a p-channel transistor M3 is also connected to the gate of the transistor M0. The source of the transistor M3 is connected to the power supply Vdd, and the drain is connected to the ground GND via a capacitor C2. Because the transistor M0 and the transistor M3 constitute a current mirror, the same current Iref as the transistor M1 also flows through the transistor M3, and the capacitor C2 is charged with the current Iref.

In addition, the drain of an n-channel transistor M4 is connected to a connection point between the drain of the transistor M3 and the capacitor C2, and the source of the transistor M4 is connected to the ground. Accordingly, the capacitor C2 is discharged when the transistor M4 is turned on.

The gate of a transistor M5 is connected to the drain of the transistor M1. The transistor M5 is a p-channel transistor, the source is connected to the power supply Vdd, and the drain is connected to the ground GND via a resistor R1. The transistor M5 is turned on when a difference between its gate voltage (=a charging voltage Vc1 of the capacitor C1) and a power supply voltage Vdd is greater than or equal to a predetermined value, that is, a threshold voltage Vgson, and the transistor M5 is turned off when the difference is less than or equal to the predetermined value. In other words, the transistor M5 is turned off when its gate voltage Vc1 becomes greater than or equal to Vdd−Vgson.

The gate of a transistor M6 is connected to the drain of transistor M3. The transistor M6 is a p-channel transistor, the source is connected to the power supply Vdd, and the drain is connected to the ground GND via a resistor R2. The transistor M6 is turned off when a difference between its gate voltage (=a charging voltage Vc2 of the capacitor C2) and the power supply voltage Vdd becomes less than or equal to the threshold voltage Vgson. That is, the transistor M6 is turned off when its gate voltage Vc2 becomes greater than or equal to Vdd−Vgson.

The drain of the transistor M5 is connected to a low active set terminal Sb of an RS type flip-flop FF. In addition, the drain of the transistor M6 is connected to a low active set terminal Rb of the flip-flop FF. An output terminal Q of the flip-flop FF is connected to the gate of the transistor M2, and an inverted output terminal Qb is connected to the gate of the transistor M4.

Description of Operation

Figure 2:
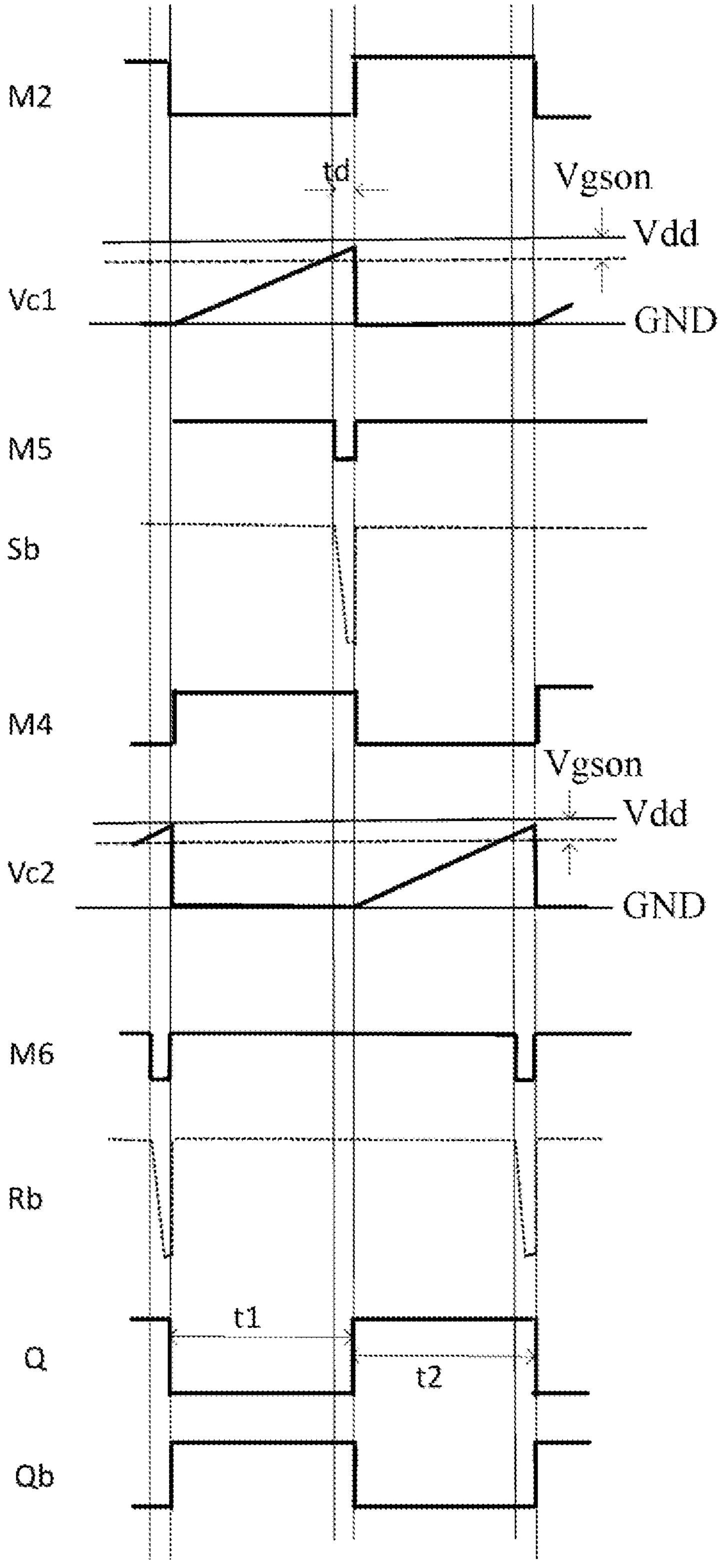
FIG. 2 is a timing chart illustrating the operation of the circuit of FIG. 1.

FIG. 2 is a timing chart illustrating the operation of the circuit of FIG. 1.

First, the state of the flip-flop FF is assumed to be “0”. In this case, the output terminal Q is at L level, the transistor M2 is off, the inverted output terminal Qb is at H level, and the transistor M4 is on. Accordingly, the capacitor C1 is charged with a constant current, and the voltage Vc1 gradually rises. On the other hand, because the transistor M4 is on, the voltage Vc2 remains at 0 V.

The voltage Vc1 of the capacitor C1 rises, and when the gate voltage of the transistor M5 becomes greater than or equal to Vdd−Vgson, the transistor M5 is turned off. Thereby, the current flowing through the resistor R1 disappears, and the voltage of a connection portion between the resistor R1 and the transistor M5 becomes 0 V. Therefore, the low active set-terminal Sb of the flip-flop FF changes from H level to L level. Thereby, the state of the flip-flop FF becomes “1”, the output terminal Q is at H level, and the inverted output terminal Qb is at L level.

Thereby, the transistor M2 is turned on and the transistor M4 is turned off. Accordingly, the capacitor C1 is discharged and the voltage Vc1 becomes 0 V. On the other hand, because the transistor M4 is turned off, the capacitor C2 is charged, and the voltage Vc2 gradually rises. Furthermore, because the transistor M2 is on, the voltage Vc1 remains at 0 V.

The voltage Vc2 of the capacitor C2 rises, and when the gate voltage of the transistor M6 becomes greater than or equal to the threshold voltage, the transistor M6 is turned off. Therefore, the low active reset terminal Rb of the flip-flop FF changes from H level to L level, the state of the flip-flop FF becomes “0”, the output terminal Q is at L level, and the inverted output terminal Qb is at H level.

Thereby, the transistor M2 is turned off and the transistor M4 is turned on. Accordingly, the capacitor C2 is discharged and the voltage Vc2 becomes 0 V. On the other hand, the capacitor C1 begins to be charged and the voltage Vc1 gradually rises. Because the transistor M4 is on, the voltage Vc2 remains at 0 V.

In this way, by charging the capacitors C1 and C2 with a constant current flowing through the transistors M1 and M3, the state of the flip-flop FF changes to “0” and “1” every predetermined duration. Accordingly, a signal of a predetermined frequency can be obtained at the output of the flip-flop FF.

If the transistors M1 and M3 have a similar configuration, and the capacitors C1 and C2 have the same capacitance, the charging of the capacitors C1 and C2 can be made equivalent, and time t1 during which the state of the flip-flop FF is “0” and time t2 during which the state of the flip-flop FF is “1” can be made the same.

Moreover, the two states of the flip-flop FF are respectively referred to as a first state and a second state. Which one of the two states is the first state or the second state is arbitrary, as long as they refer to different states of “0” or “1” respectively.

Next, the above operation is described using equations. Here, it is assumed that M0:M1:M3=1:1:1, C1=C2=C, td (operation delay time)<<t1 (½ of the output period). In addition, the charging current is set to Iref, and the threshold voltage of the transistor is set to Vgson.

First, a charge q of the capacitor is a value obtained by multiplying a capacitance C of the capacitor by its voltage V.

$$q=C*V$$

The charge q of the capacitor is a value obtained by multiplying a current I by charging time t.

$$I*t=q=C*V$$

The transistors M5 and M6 are turned off when the voltages of the capacitors C1 and C2 become greater than or equal to (Vdd−Vgson).

Accordingly, $$Iref*t1=C1*(Vdd-Vgson).$$

Therefore, $$t1=C1*(Vdd-Vgson)/Iref.$$

In addition, the charging current Iref is a current flowing through the resistor R0 on the downstream side of the transistor M0, and the voltage drop in the diode-connected transistor M0 is Vgson, and therefore, $$Iref=(Vdd-Vgson)/R0.$$

Accordingly, $$t1=C1*R0=C*R0.$$

t2 is also the same, $$t2=C2*R0=C*R0=t1.$$

Thus, the clock timing does not depend on the power supply, and the duty ratio is 50%.

Because the relaxation oscillator according to the embodiment uses a constant current for charging, the slope of the voltage is constant at a trigger point where the transistors M5 and M6 are turned off, and a stable operation is obtained. For example, a capacitor-resistor (CR) type relaxation oscillator has a problem in the operation at the trigger point because the charging current becomes smaller in the vicinity of the trigger point, but this kind of problem does not exist in the relaxation oscillator related to the disclosure.

In addition, in the embodiment, it is sufficient to control the on/off of the transistors M5 and M6 by the charging voltage of the capacitor, so that the current consumption may be relatively small, and a high-speed operation can be realized with a simple configuration.

In addition, because switching can be performed using the charging voltage of the capacitor, which is close to the power supply voltage, it is resistant to noise and suitable for miniaturization of the capacitor.

Because the charging current of the capacitor is the current flowing through the transistors M1 and M3 and is proportional to the comparison voltage (Vdd−Vgson), and a voltage at which the charging is stopped is also (Vdd−Vgson), the time constant of the circuit operation does not depend on the power supply voltage.

Variation Example 1

Figure 3:
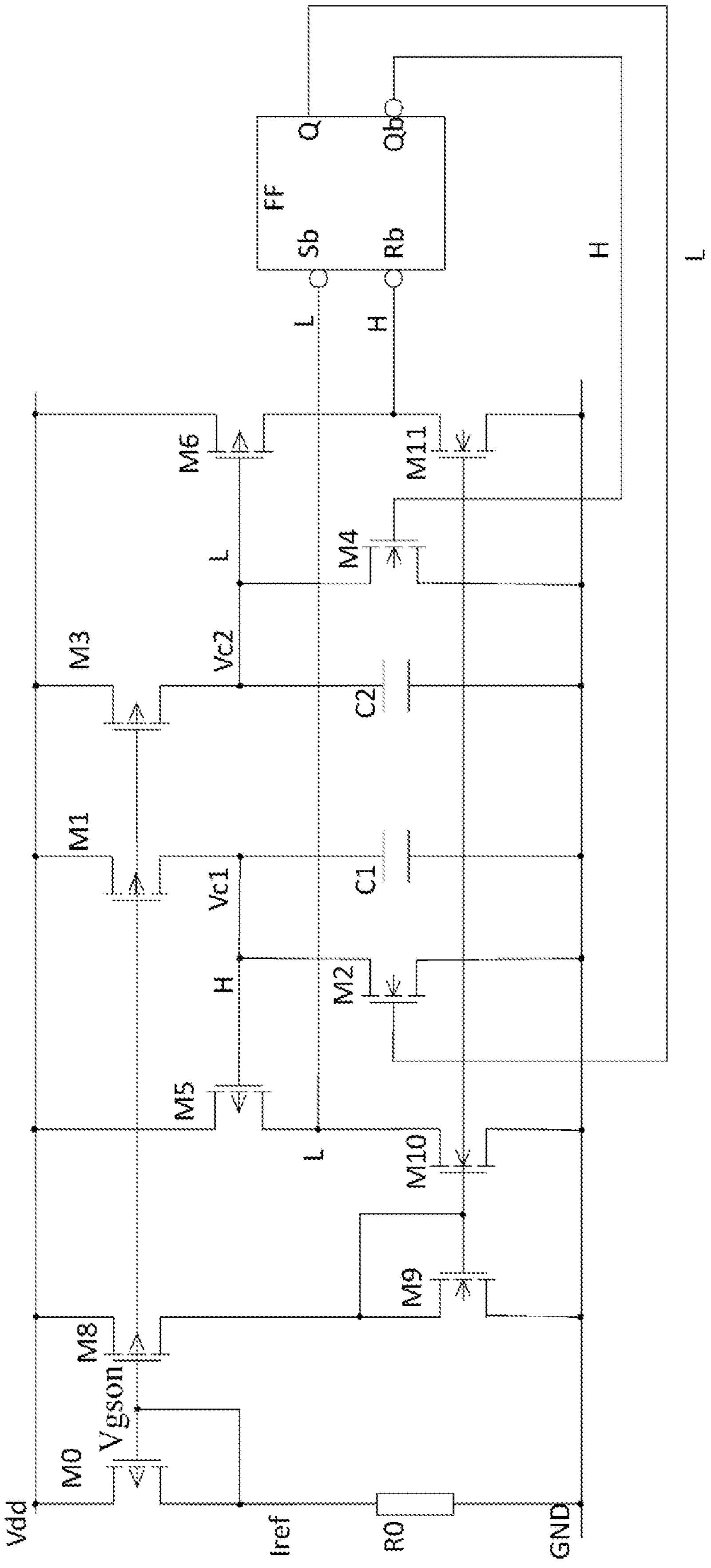
FIG. 3 is a circuit diagram showing the configuration of Variation example 1.

FIG. 3 is a circuit diagram showing the configuration of Variation example 1. Compared with the configuration of FIG. 1, the resistors R1 and R2, which serve as loads of the transistors M5 and M6, are replaced with constant current sources.

That is, a p-channel transistor M8 whose gate is connected to the transistor M0 and whose source is connected to the power supply Vdd is arranged, and a current corresponding to the current Iref flowing through the transistor M0 is made to flow here. The drain of the transistor M8 is connected to the drain of an n-channel transistor M9. There is a short circuit, that is, a diode connected between the gate and the drain of the transistor M9, and the source is connected to the ground.

The gate of an n-channel transistor M10 is connected to the gate of the transistor M9, and the drain of the transistor M10 is connected to the source of the transistor M5. The transistor M9 and the transistor M10 constitute a current mirror. The transistor M5 makes a sufficient current flow in the case of on, but when the transistor M5 is on, the current flowing through the transistor M5 becomes the same current as the transistor M10, and the drain of the transistor M5, that is, the low active set terminal Sb of the flip-flop FF is at H level. On the other hand, when the transistor M5 is off, in order to make a current flow through the transistor M10, the drain of the transistor M5, that is, the low active set terminal Sb of the flip-flop FF is at L level.

In addition, although the timing is opposite, a transistor M11 operates in the same manner as the transistor M10, and the low active set terminal of the flip-flop FF is at H level when the transistor M6 is on, and is at L level when the transistor M6 is off. Moreover, FIG. 3 shows a signal level when the state of the flip-flop FF is "0".

In this way, in this Variation example 1, the same operation as the example of FIG. 1 can also be performed. In addition, because transistors are used in place of the resistors R1 and R2, an oscillator of higher precision can be obtained.

Variation Example 2

Figure 4:
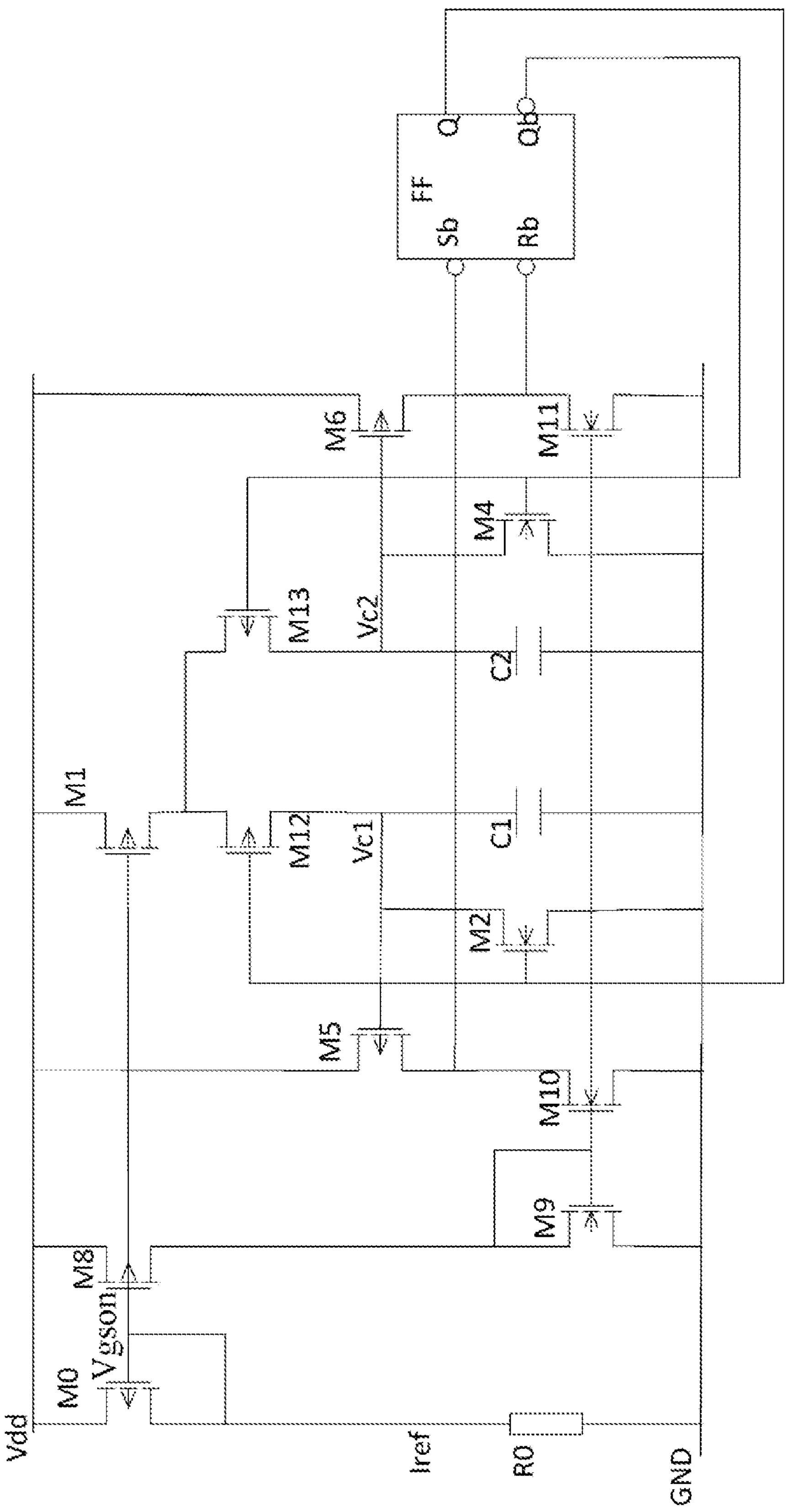
FIG. 4 is a circuit diagram showing the configuration of Variation example 2.

FIG. 4 is a circuit diagram showing the configuration of Variation example 2. In Variation example 2, compared with the configuration of FIG. 1, a selector configured by transistors M12 and M13 is added, and thereby, in regard to the charging current to the capacitors C1 and C2, the transistor M3 is omitted, and the capacitors C1 and C2 can be charged alternately with the current from one current source, that is, the transistor M1. Accordingly, the power consumption can be reduced.

That is, the sources of the p-channel transistors M12 and M13 are connected to the drain of the transistor M1. The drain of the transistor M12 is connected to the capacitor C1, and the drain of the transistor M13 is connected to the capacitor C2. In addition, the gate of the transistor M12 is connected to the output terminal Q of the flip-flop FF, and the gate of the transistor M13 is connected to the inverted output terminal Qb of the flip-flop FF.

Accordingly, when the transistor M2 is off, the transistor M12 is turned on and the capacitor C1 is charged, and when the transistor M4 is off, the transistor M13 is turned on and the capacitor C2 is charged.

Effect of Embodiment

According to the embodiments, an oscillator, which is a relatively simple circuit, is easy to implement, and also has a small number of components, can be realized. By making the charging voltages of the capacitors C1 and C2 close to the voltage of the power supply Vdd, the transistors M5 and M6 are turned off, and therefore it is possible to make full use of the power supply voltage to oscillate, furthermore, phase noise can be reduced.

The gates and sources of the transistors M5 and M6 operate as a negative input and a positive input of a comparator having a predetermined offset voltage. Therefore, instead of the use of a conventional two-input comparator having a voltage reference, the transistors M5 and M6 operate as a comparator.

In addition, the above offset is the same as Vgs of the transistor M0, and these two cancel each other out. Therefore, high-precision oscillation can be realized.

This kind of high-speed comparator, which is simple and has sufficient precision, is suitable for high-frequency oscillation.

In addition, oscillation frequency can be easily adjusted by tuning the resistor R0.

Supplementary Note

The capacitor C1 is referred to as a first capacitor, the capacitor C2 is referred to as a second capacitor, and the transistors M1 to M11 are referred to as first to eleventh transistors, respectively.

DESCRIPTION OF THE REFERENCE SIGNS

M0 to M11: transistor
C1 to C2: capacitor
FF: flip-flop

What is claimed is:

1. A relaxation oscillator, comprising:
a first transistor, through which a constant current is made to flow;
a first capacitor, which is charged by a current from the first transistor;
a second transistor, which draws a charge of the first capacitor;
a third transistor, through which a constant current is made to flow;
a second capacitor, which is charged by a current from the third transistor;
a fourth transistor, which draws a stored charge of the second capacitor;

a fifth transistor, wherein the fifth transistor is a p-channel transistor, and the fifth transistor receives the charging voltage of the first capacitor at a control end and is turned on/off;

a sixth transistor, wherein the sixth transistor is a p-channel transistor, and the sixth transistor receives the charging voltage of the second capacitor at a control end and is turned on/off; and a flip-flop, whose state changes from a first state to a second state when a charging voltage of the first capacitor reaches a predetermined value, and changes from the second state to the first state when a charging voltage of the second capacitor reaches a predetermined value, the flip-flop causing the second transistor to be turned off and the fourth transistor to be turned on in the first state, and causing the second transistor to be turned on and the fourth transistor to be turned off in the second state, wherein the state of the flip-flop changes as the fifth transistor and the sixth transistor are turned on/off;

the relaxation oscillator outputting a signal of a predetermined frequency from the flip-flop, wherein the relaxation oscillator comprises a first resistor, the first resistor being connected in series to the fifth transistor, wherein a source of the fifth transistor is connected to a power supply, and a drain of the fifth transistor is connected to a ground via the first transistor, and the voltage of a connection point between the fifth transistor and the first resistor changing as the fifth transistor is turned on/off;

the state of the flip-flop changes according to the voltage change of the connection point between the first resistor and the drain of the fifth transistor;

the relaxation oscillator comprises a second resistor, the second resistor being connected in series to the sixth transistor, wherein a source of the sixth transistor is connected to the power supply, and a drain of the sixth transistor is connected to the ground via the second transistor, and the voltage of a connection point between the sixth transistor and the first resistor changing as the sixth transistor is turned on/off; and the state of the flip-flop changes according to the voltage change of the connection point between the second resistor and the drain of the sixth transistor.

2. The relaxation oscillator according to claim 1, comprising:

an additional transistor, of which a diode-connected control end is connected to control ends of the first transistor and the third transistor; and an additional resistor, which is connected in series to the additional transistor; wherein the magnitudes of a constant current flowing through the first transistor and a constant current flowing through the second transistor are adjusted by a resistance value of the additional resistor.

* * * * *